United States Patent
Aono

(10) Patent No.: US 7,463,458 B2
(45) Date of Patent: Dec. 9, 2008

(54) MAGNETORESISTIVE-EFFECT DEVICE WITH A MULTI-LAYER MAGNETORESISTIVE-EFFECT FILM

(75) Inventor: Akifumi Aono, Niihama (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/928,473

(22) Filed: Oct. 30, 2007

(65) Prior Publication Data

US 2008/0055785 A1 Mar. 6, 2008

Related U.S. Application Data

(62) Division of application No. 10/535,994, filed as application No. PCT/JP03/15300 on Nov. 28, 2003, now Pat. No. 7,312,958.

(30) Foreign Application Priority Data

Dec. 5, 2002 (JP) ............................. 2002-354064

(51) Int. Cl.
G11B 5/39 (2006.01)
G11B 5/127 (2006.01)

(52) U.S. Cl. ................................. 360/324.11

(58) Field of Classification Search ................. 360/324, 360/324.1, 324.12, 324.11, 324.2, 314
See application file for complete search history.

(56) References Cited

U.S. PATENT DOCUMENTS

| | | | |
|---|---|---|---|
| 6,331,773 B1 * | 12/2001 | Engel | ........................... 324/252 |
| 6,413,380 B1 | 7/2002 | Pinarbasi | |
| 6,428,657 B1 | 8/2002 | Pinarbsi | |
| 6,482,329 B1 | 11/2002 | Takahashi et al. | |
| 6,500,676 B1 | 12/2002 | Ramberg | |
| 6,597,547 B1 | 7/2003 | Kawawake et al. | |
| 6,671,138 B2 * | 12/2003 | Noma et al. | ........... 360/324.12 |
| 6,700,753 B2 * | 3/2004 | Singleton et al. | ......... 360/324.1 |
| 6,735,061 B2 | 5/2004 | Pinarbasi | |
| 7,201,827 B2 | 4/2007 | Horng et al. | |
| 7,211,447 B2 | 5/2007 | Horng et al. | |
| 7,312,958 B2 * | 12/2007 | Aono | .................... 360/324.11 |

(Continued)

FOREIGN PATENT DOCUMENTS

EP     959146 A2    11/1999

(Continued)

OTHER PUBLICATIONS

R.F.C Farrow et al., "Enhanced blocking temperature in NiO spin valves: Role of cubic spinel ferrite between pinned layer and NiO," Aug. 2000, Applied Physics Letters, vol. 77, No. 8, pp. 1191-1193.*

(Continued)

Primary Examiner—William J Klimowicz
(74) Attorney, Agent, or Firm—Steptoe & Johnson LLP

(57) ABSTRACT

A magnetic disk apparatus having a highly sensitive reproducing head and a method for manufacturing the magnetic disk apparatus are disclosed. A spin-valve-type multilayer film composed of an antiferromagnetic layer, a ferromagnetic layer, a nonmagnetic layer and a free magnetic layer is used as a magnetoresistive-effect device for the reproducing head. An antiferromagnetic reaction layer is formed between the antiferromagnetic layer and the ferromagnetic layer. The antiferromagnetic reaction layer is formed of a metallic compound containing oxygen.

9 Claims, 9 Drawing Sheets

U.S. PATENT DOCUMENTS

| | | | |
|---|---|---|---|
| 2002/0012207 A1* | 1/2002 | Singleton et al. | 360/324.1 |
| 2002/0044399 A1* | 4/2002 | Noma et al. | 360/324.12 |
| 2002/0048127 A1 | 4/2002 | Fukuzawa et al. | |
| 2002/0159198 A1 | 10/2002 | Pinarbasi | |
| 2003/0167625 A1* | 9/2003 | Li et al. | 29/603.07 |
| 2003/0206381 A1* | 11/2003 | Hou et al. | 360/324.11 |
| 2005/0115823 A1 | 6/2005 | Davis | |

FOREIGN PATENT DOCUMENTS

| | | |
|---|---|---|
| JP | 4-358310 | 12/1992 |
| JP | 6-236527 | 8/1994 |
| JP | 10183347 A | 7/1998 |
| JP | 10188234 A | 7/1998 |
| JP | 2002-7674 | 3/2002 |
| JP | 2002198584 A | 7/2002 |
| JP | 2000-348935 | 12/2002 |
| JP | 2003183838 A | 7/2003 |

OTHER PUBLICATIONS

J.C.S.Kools et al. "Magnetic Properties of Specular Spin-Valves Containing Nano-Oxide Layers," Jul. 2001, IEEE Transactions on Magnetics, vol. 37, No. 4, pp. 1783-1785.*

* cited by examiner

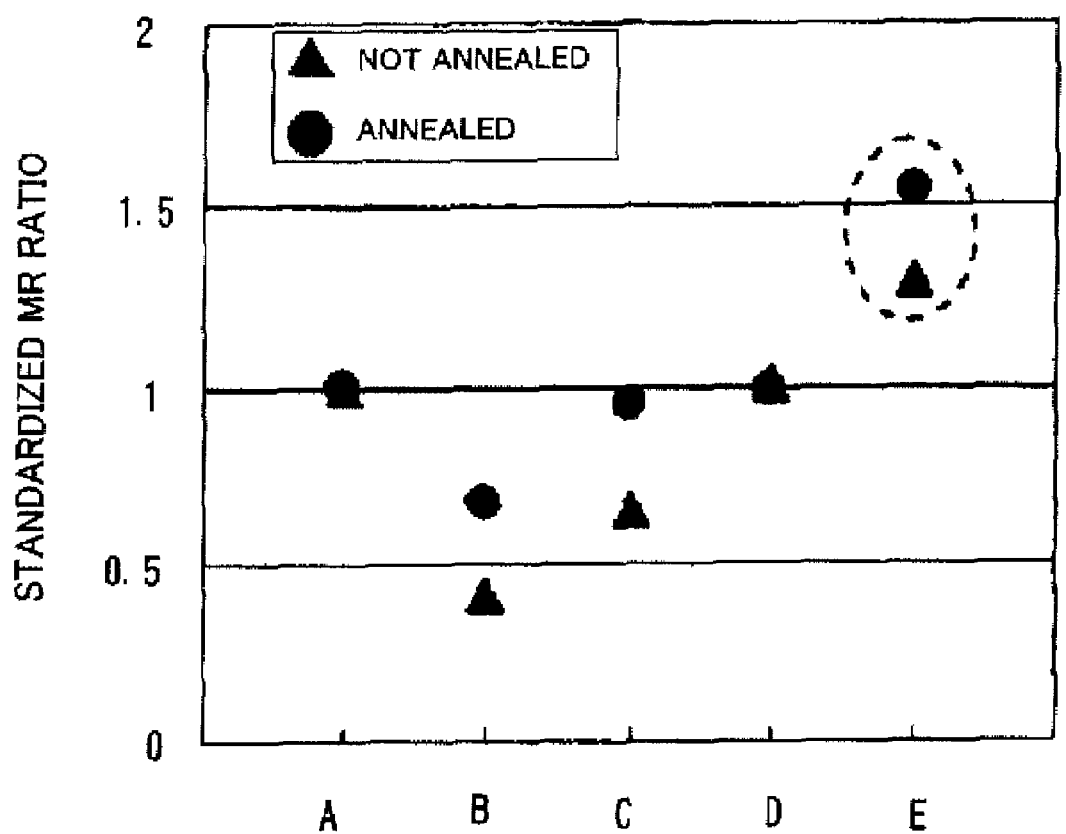
F I G. 1 0

MAGNETORESISTIVE-EFFECT DEVICE WITH A MULTI-LAYER MAGNETORESISTIVE-EFFECT FILM

REFERENCE TO RELATED APPLICATIONS

This application is a divisional of application Ser. No. 10/535,994 filed May 25, 2005, now U.S. Pat. No. 7,312,958, which is a national stage of PCT International Application No. PCT/JP03/15300 filed Nov. 28, 2003, which claims the benefit of Japanese Patent Application No. 2002-354064 filed Dec. 5, 2002.

TECHNICAL FIELD

The present invention relates to a magnetic disk apparatus and a method of manufacturing the magnetic disk apparatus and, more particularly, to a magnetic disk apparatus having a magnetoresistive-effect device using a spin valve magnetoresistive effect, which device is used in a reproducing head or a magnetic field sensor, and to a method of manufacturing the magnetic disk apparatus.

BACKGROUND ART

In recent years, the need to increase the processing speed and the recording capacity in recording on magnetic disk media in magnetic disk apparatuses (HDD apparatuses) or the like has increased. Schemes to develop high-density magnetic recording media are now being contrived and pursued. With this movement, reproducing heads used for reproduction from reproducing tracks of smaller widths and having larger reproduction outputs in comparison with conventional thin-film magnetic heads are being developed. It is certain that this tendency will be accelerated in future.

Spin-valve-type magnetoresistive-effect films are presently being used ordinarily in magnetoresistive-effect devices for reproducing heads. A spin-valve magnetoresistive-effect film has a basic structure formed of a free magnetic layer, a nonmagnetic layer, a fixed magnetic layer and an antiferromagnetic layer.

A structure designed to increase the recording density by increasing the sensitivity of such a spin-valve magnetoresistive-effect film is known. For example, Japanese Patent Laid-Open No. 6-236527 discloses a structure in which the thickness of a free magnetic layer is increased and an electroconductive layer is formed adjacent to and at the back of the free magnetic layer to increase the mean free path.

Also, "Kamiguchi et al "CoFe SPECULAR SPIN VALVES WITH A NANO OXIDE LAYER" Digests of Intermag 1999, DB-01, 1999" discloses a technique of obtaining a so-called specular reflection effect by inserting between a free layer and a fixed magnetic layer an extremely thin oxide layer called NOL (Nano Oxide Layer) and causing conduction electrons to be reflected by the interface between the oxide layer and a metal layer. In this arrangement, a spin valve film is formed like a pseudo artificial grating film, whereby the MR ratio can be improved.

Japanese Patent Laid-Open No. 7-262520 discloses a report saying that when a GMR device constituted by a multilayer film uses a CPP (current perpendicular-to-the-plane) mode in which a current is caused to flow perpendicularly to a film surface, it has a change in resistance twice that in the conventional CIP (current in-the-plane) mode in which a current is caused to flow parallel to the film surface. An increasing number of adaptations to CPP-spin valve films are being made.

Under circumstances where there will be a stronger demand for increasing the recording density of magnetic recording media, there is a challenge to further increase the sensitivity of magnetoresistive films in magnetoresistive-effect devices for reproducing heads in order to reproduce signals recorded at short wavelengths on magnetic recording media.

DISCLOSURE OF THE INVENTION

In view of the above-described technical problem in the known art, an object of the present invention is to implement a magnetic disk apparatus having a thin-film magnetic head improved in sensitivity by devising the structure of a magnetoresistive-effect film used in a magnetoresistive-effect device for the magnetic disk apparatus, and a method of manufacturing the magnetic disk apparatus.

A magnetic disk apparatus provided to achieve this object according to a first aspect of the present invention is a magnetic disk apparatus including a magnetoresistive-effect device using a magnetoresistive-effect film which is a spin-valve-type multilayer film constituted by an antiferromagnetic layer, a ferromagnetic layer, a nonmagnetic layer and a free magnetic layer, wherein an antiferromagnetic reaction layer is provided between the antiferromagnetic layer and the ferromagnetic layer, and the antiferromagnetic reaction layer is formed of a metallic compound containing oxygen.

According to this arrangement, since the antiferromagnetic reaction layer is provided between the antiferromagnetic layer and the ferromagnetic layer in the magnetoresistive-effect film constituting the magnetoresistive-effect device, electrons can be reflected by the interface between the antiferromagnetic reaction layer and the metallic layer to increase the degree of diffusion of electrons, thereby obtaining a high MR ratio and achieving a higher recording density.

A magnetic disk apparatus in a second aspect of the present invention is a magnetic disk apparatus including a magnetoresistive-effect device capable of operating with a current direction perpendicular to the film surface (CPP mode) using a magnetoresistive-effect film which is a spin-valve-type multilayer film constituted by antiferromagnetic layers, ferromagnetic layers, nonmagnetic layers and a free magnetic layer, wherein an antiferromagnetic reaction layer is provided between the antiferromagnetic layers and the ferromagnetic layers, and the antiferromagnetic reaction layers are formed of a metallic compound containing oxygen.

According to this arrangement, a high MR ratio can be obtained even in a magnetic disk apparatus having a magnetoresistive-effect device operating in a CPP mode to achieve a higher recording density.

Preferably, in the first and second aspects of the present invention, the antiferromagnetic reaction layer is formed of a Mn-based metallic compound containing oxygen, and the film thickness thereof is 0.1 to 2.5 nm. Preferably, the antiferromagnetic reaction layer contains at least one constituent selected from nitrogen, hydrogen and $H_2O$. Further, preferably, the antiferromagnetic reaction layer is formed by natural oxidation or plasma oxidation.

Preferably, the antiferromagnetic layers are formed of a Mn-based alloy containing at least one constituent selected from Pt, Ir, Ru and Rh, and a base layer under the antiferromagnetic layer is formed of NiFe or NiFeCr.

Preferably, the ferromagnetic layers and the free magnetic layer are formed of an alloy containing at least one of Fe, Co and Ni, and the nonmagnetic layers are formed of an alloy containing Cu. Further, preferably, the ferromagnetic layers are formed in a stacked ferromagnetic structure constituted by a first ferromagnetic layer, a metallic intermediate layer and a second ferromagnetic layer, and the metallic intermediate layer is formed of an alloy containing at least one constituent selected from Ru, Cu, Rh, Pd, Ag, Ir, Pt and Au.

According to the present invention, there are provided methods of manufacturing the magnetic disk apparatuses in the first and second aspects. The first manufacturing method includes, to form the magnetoresistive-effect film as a film in which the antiferromagnetic reaction layer is provided between the antiferromagnetic layer and the ferromagnetic layer, conveying a substrate into a first chamber and forming the antiferromagnetic layer in a vacuum atmosphere in the first chamber, conveying the substrate into a second chamber and performing vacuum discharge in the second chamber at a degree of vacuum lower than that in the first chamber to form the antiferromagnetic reaction layer, and taking out the substrate from the second chamber and forming the ferromagnetic layer on the antiferromagnetic reaction layer in another chamber.

The second manufacturing method includes, to form the magnetoresistive-effect film as a film in which the antiferromagnetic reaction layer is provided between the antiferromagnetic layer and the ferromagnetic layer, conveying a substrate into a first chamber and forming the antiferromagnetic layer in a vacuum atmosphere in the first chamber, conveying the substrate into a second chamber and performing a surface treatment using a gas containing 1 ppm or higher of $H_2O$ or $O_2$ to form the antiferromagnetic reaction layer, and taking out the substrate from the second chamber and forming the ferromagnetic layer on the antiferromagnetic reaction layer in another chamber.

Preferably, in the above-described first and second manufacturing methods, the degree of vacuum in the first chamber is in the range from $1\times10^{-6}$ to $1\times10^{-8}$ Pa.

The third manufacturing method includes, to form the magnetoresistive-effect film as a film in which the antiferromagnetic reaction layer is provided between the antiferromagnetic layer and the ferromagnetic layer, conveying a substrate into a first chamber and forming the antiferromagnetic layer in a vacuum atmosphere in the first chamber, conveying the substrate into a second chamber and exposing the substrate to an atmosphere in which the $H_2O$ concentration or the $O_2$ concentration is higher than that in the first chamber to form the antiferromagnetic reaction layer, and taking out the substrate from the second chamber and forming the ferromagnetic layer on the antiferromagnetic reaction layer in another chamber.

Preferably, in the above-described first to third manufacturing methods, the substrate is exposed to the vacuum atmosphere in the second chamber for a time period of 60 seconds or longer. Also, the method is preferably such that, after the completion of the process in the second chamber, the substrate is again conveyed into the first chamber and a film forming process of forming the ferromagnetic layer and other layers is thereafter performed.

Each of the above-described first to third manufacturing methods can be easily implemented by using a helicon long-throw sputtering apparatus.

According to the present invention, as described above, an antiferromagnetic reaction layer is formed between an antiferromagnetic layer and a ferromagnetic layer in a spin-valve-type magnetoresistive-effect film having the antiferromagnetic layer, the ferromagnetic layer, a nonmagnetic layer and a free magnetic layer to increase the MR ratio of the magnetoresistive-effect device and to thereby obtain a higher head output. A magnetic disk apparatus having such a high-sensitivity reproducing head is capable of realizing high-density recording and an increased recording capacity recently in demand.

BRIEF DESCRIPTION OF THE DRAWINGS

FIG. 10 is a graph showing the MR ratio with respect to standing-in-vacuum conditions according to the embodiment.

BEST MODE FOR CARRYING OUT THE INVENTION

Embodiments of the present invention will be described with reference to the drawings. The present invention is not limited to the embodiments described below. The present invention can be applied to magnetic disk apparatuses having a magnetoresistive-effect devices using spin-valve-type magnetoresistive-effect films.

EMBODIMENT 1

FIGS. 1 to 5 show Embodiment 1 of the present invention.

Figure 1:
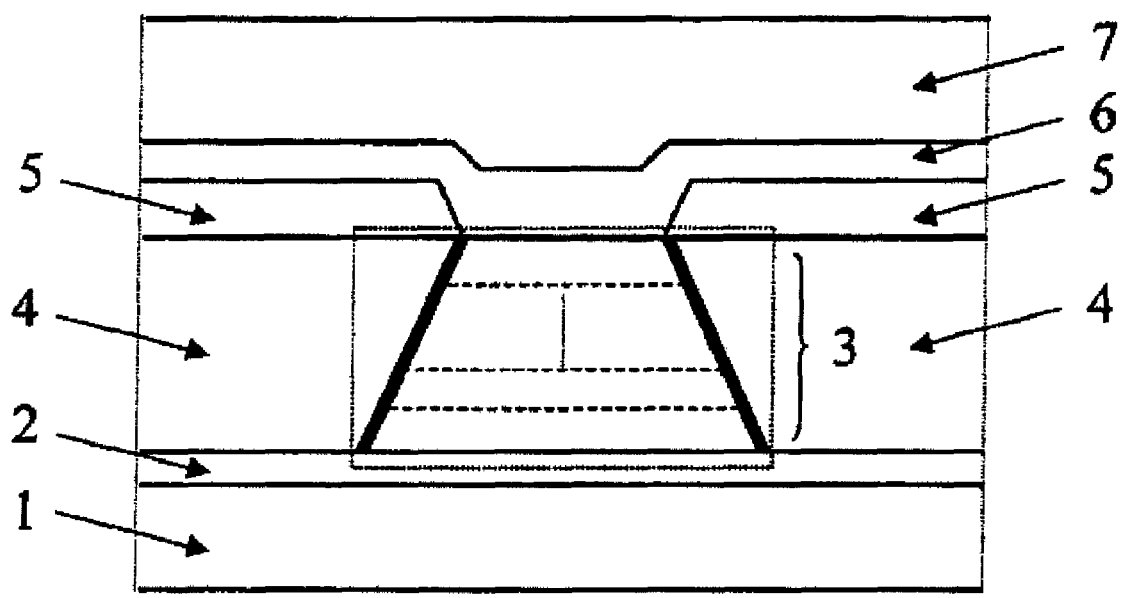
FIG. 1 is an enlarged schematic sectional view of an essential portion of a reproducing head of a magnetic disk apparatus according to Embodiment 1 of the present invention as seen from a head slide surface facing a magnetic recording medium.

In a reproducing head of the magnetic disk apparatus shown in FIG. 1, a lower gap insulating layer 2 formed of a nonmagnetic insulating material such as $Al_2O_3$, AlN or $SiO_2$ is provided on a lower shield layer 1, which is a magnetic film formed of, for example, a soft magnetic material such as permalloy, a Co-based amorphous material, or Fe-based fine particles. A GMR device 3 is provided on the lower gap insulating layer 2. The GMR device 3, not shown in detail, is a multilayer film including an antiferromagnetic layer, a ferromagnetic layer, a nonmagnetic layer and a free magnetic layer. The structure of the GMR device 3 will be concretely described below. Opposite side portions of the multilayer film forming the GMR device 3 are formed by etching processing such as ion milling so that the film has the shape of a trapezoidal block having slanted side surfaces. A pair of left and right hard bias layers 4 are provided on opposite sides of the multilayer film. The hard bias layers 4 are formed on the lower gap insulating layer 2 so as to contact at least the opposite side surfaces of the free magnetic layer constituting the GMR device 3. The hard bias layers 4 are formed of a hard magnetic material, such as a CoPt-based alloy. A pair of left and right electrode lead layers 5 are formed of a material such as Cu, Cr or Ta on the hard bias so as to contact at least the GMR device 3 in a line contact manner. An upper gap insulating layer 6 is formed on the pair of left and right electrode lead layers 5 and the GMR device 3. The upper gap insulating layer 6 is formed of the same insulating material as that of the lower gap insulating layer 2. An upper shield layer 7 formed of the same soft magnetic material as that of the lower shield layer 1 is formed on the upper gap insulating layer 6.

Figure 2A:
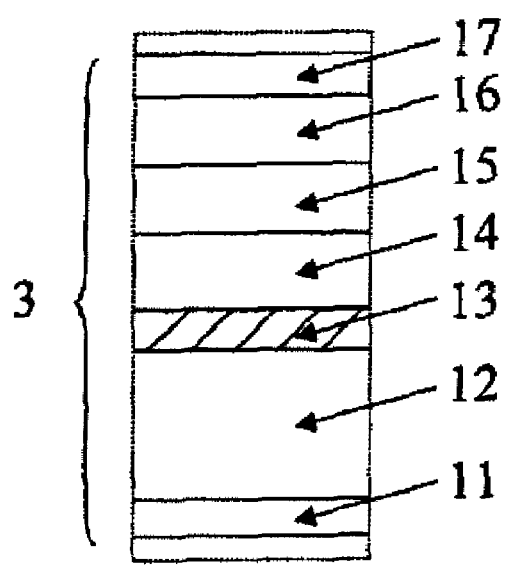
FIG. 2 shows diagrams schematically depicting structures of magnetoresistive-effect films according to the embodiment.
Figure 2B:
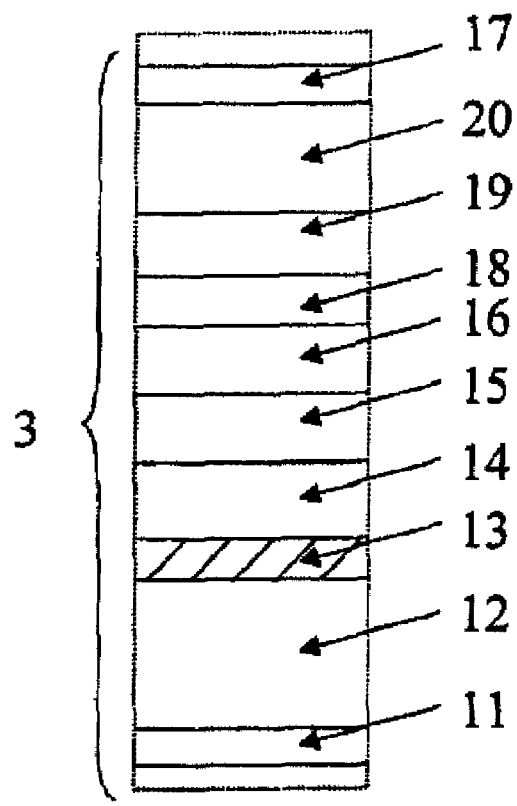

As shown in FIGS. 2a and 2b, the GMR device 3 is constituted by a spin valve type of magnetoresistive-effect film.

FIG. 2a shows a spin valve film of a bottom-type spin valve structure formed of a base layer 11, an antiferromagnetic layer 12, an antiferromagnetic reaction layer 13, a ferromagnetic layer 14, a nonmagnetic layer 15, a free magnetic layer 16 and a projective layer 17.

FIG. 2b shows a spin valve film of a dual spin valve structure formed of a base layer 11, a first antiferromagnetic layer 12, an antiferromagnetic reaction layer 13, a first ferromagnetic layer 14, a first nonmagnetic layer 15, a free magnetic layer 16, a second nonmagnetic layer 18, a second ferromagnetic layer 19, a second antiferromagnetic layer 20 and a protective layer 17.

The antiferromagnetic reaction layer 13 is thus provided between the antiferromagnetic layer 12 and the ferromagnetic layer 14 to increase the MR ratio of the spin valve film and to thereby enable the head to have a higher output.

Details of the spin valve film will be described.

The base layer 11 is used for the purpose of improving the adhesion between the lower gap layer 2 and the spin valve film and improving the alignment of the spin valve film. The base layer 11 is ordinarily formed of a Ta film. Preferably, for a further improvement in the alignment of the spin valve film, the base layer 11 is formed in a two-layer structure: Ta layer/NiFe-based alloy layer for example.

To examine the influence of the base layer 11 on the spin valve film, the bottom-type spin valve film was formed on base layers 11 formed of various materials and X-ray diffraction was effected. The spin valve film in this construction is the same as that in the conventional art.

FIGS 3A-3D show measurement results obtained.

Figure 3A:
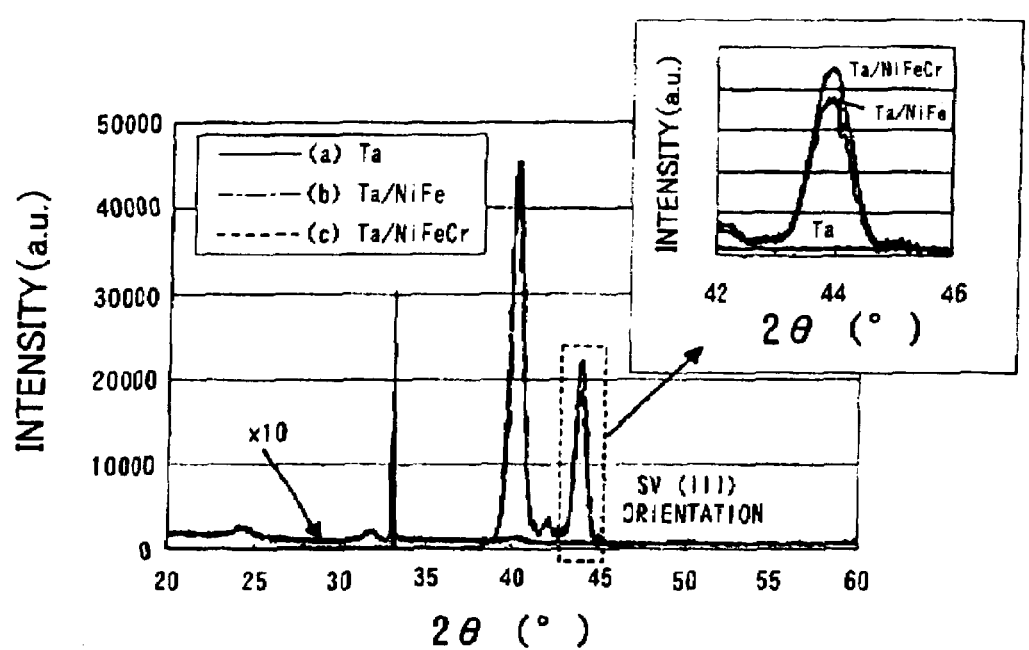
FIGS. 3A, 3B, 3C, and 3D are X-ray diffraction profiles showing dependency of the magnetoresistive-effect film on base material base materials according to the embodiment.
Figure 3B:
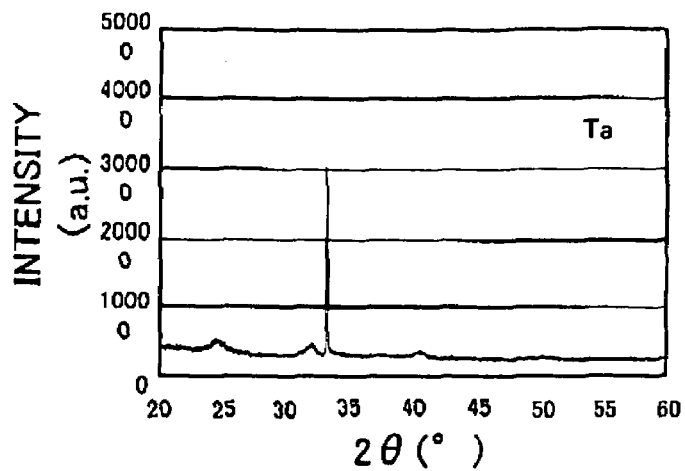
Figure 3C:
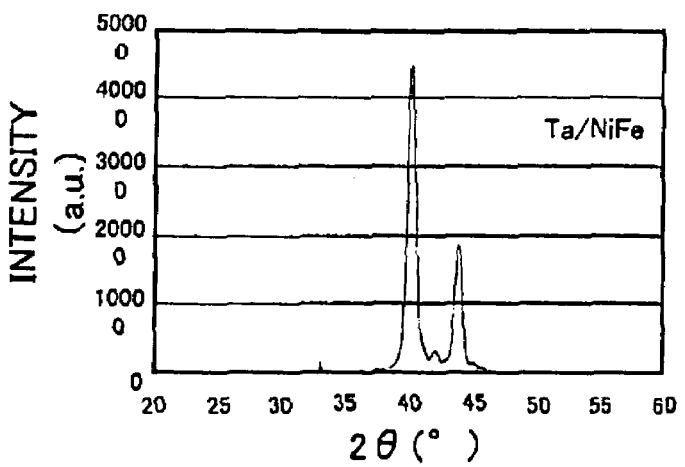
Figure 3D:
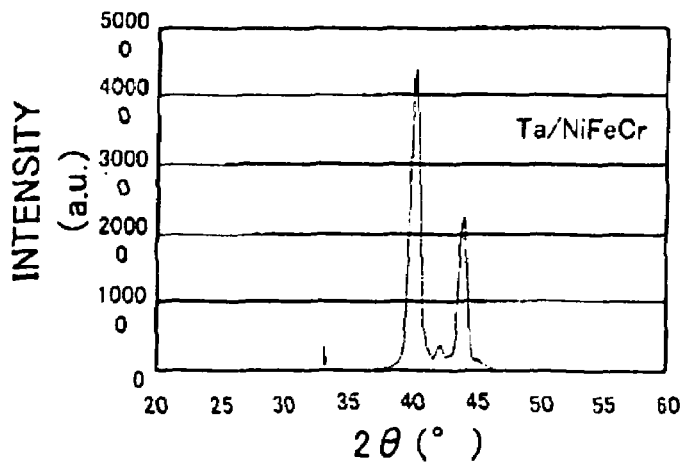

In FIGS. 3A-3D, the ordinate represents the strength and the abscissa represents the diffraction angle. In FIG. 3B, the base layer 11 is a Ta layer. In FIG. 3C, the base layer 11 has a two-layer structure: Ta layer/NiFe. In FIG. 3D, the base layer 11 has a two-layer structure: Ta layer/NiFeCr.

Referring to the SV (111) diffraction peak in FIGS.3A-3D near the 44 degree point, the diffraction peak of the spin valve film on the Ta base is very weak, while the (111) diffraction peaks of the spin valve films on the two-layer structures indicated by 3C and 3D are very high. Thus, it is apparent that the alignment of the spin valve film is improved if the base layer 11 is formed in a two-layer structure.

While the bottom-type spin valve film has been described by way of example, the same fact has been confirmed with respect to other spin valve films including a spin valve film of a dual spin valve structure, Also, while a Ta single layer structure, a two-layer structure formed of Ta layer and a NiFe layer and a two-layer structure formed of Ta layer and a NiFeCr layer have been described as the base layer 11, the present invention is not limited to this example. The base layer 11 may be formed of any other material. Also, an arrangement without the base layer 11 may be used.

The antiferromagnetic layer 12 plays the role of exchange coupling to the ferromagnetic layer 14. In the spin valve film having a dual spin valve structure, the first antiferromagnetic layer 12 plays the role of exchange coupling to the first ferromagnetic layer 14, and the second antiferromagnetic layer 20 plays the role of exchange coupling to the second ferromagnetic layer 19.

Preferably, each of the antiferromagnetic layers 12 and 20 is formed of an Mn-based alloy. More preferably, an Mn-based alloy containing at least one element selected from Pt, Ir, Ru and Rh. In the present invention, it is preferable to use an IrMn film in particular. The IrMn film can be formed by performing sputtering using a 20 at % Ir-80 at % Mn target so that a predetermined film composition is obtained under the control at a sputtering argon gas pressure.

The antiferromagnetic reaction layer 13, which is a feature of the present invention, is for obtaining a high MR ratio by intensifying the interlayer coupling magnetic field between the antiferromagnetic layer 12 and the ferromagnetic layer 14. Preferably, the antiferromagnetic reaction layer 13 is formed of a metallic compound containing oxygen. More preferably, the antiferromagnetic reaction layer 13 is formed of an Mn-based metallic compound containing oxygen. A layer formed of such a metallic compound can be obtained by an oxidation process such as natural oxidation or plasma oxidation.

Preferably, at least one element or compound selected from nitrogen, hydrogen and $H_2O$ is contained as an additive element in the antiferromagnetic reaction layer 13.

The thickness of the antiferromagnetic reaction layer 13 is preferably in the range of 0.1 to 2.5 nm, more preferably in the range of 0.1 to 2.0 nm, most preferably in the range of 0.15 to 2.0 nm. If the thickness of the antiferromagnetic reaction layer 13 exceeds 2.5 nm, the interlayer coupling magnetic field between the antiferromagnetic layer 12 and the ferromagnetic layer 14 is so weak that the MR ratio cannot be sufficiently increased. If the thickness of the antiferromagnetic reaction layer 13 is smaller than 0.1 nm, a sufficiently high MR ratio cannot be obtained.

To check the MR ratio improving effect of the antiferromagnetic reaction layer 13, MR curves were measured with respect to the conventional spin valve film with no antiferromagnetic reaction layer and the spin valve film of the present invention having the antiferromagnetic reaction layer 13.

Figure 4A:
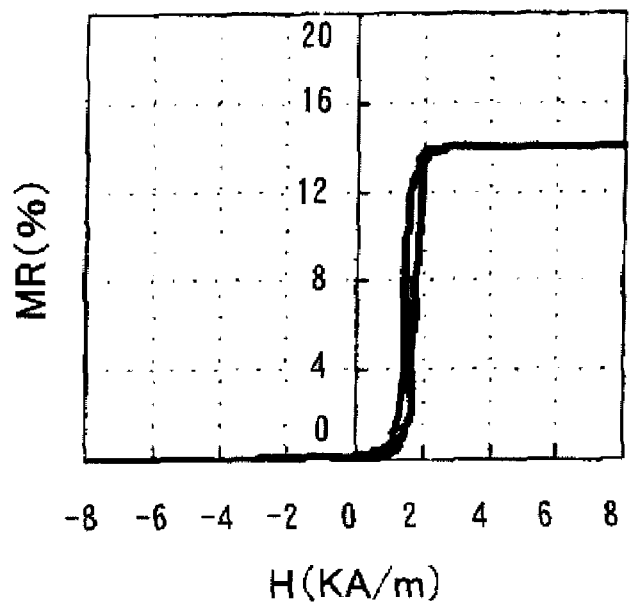
FIG. 4 shows graphs depicting the results of measurement of MR ratios, respectively, of a conventional spin valve film and of a spin valve film according to the embodiment.
Figure 4B:
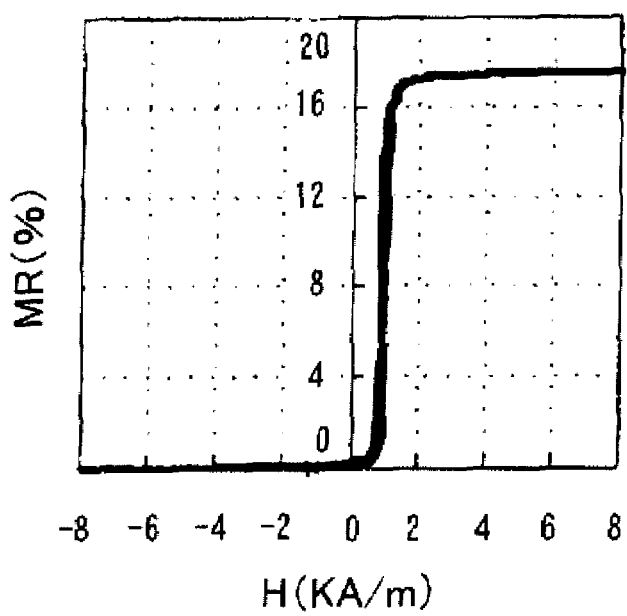

FIG. 4a shows the MR curve of the conventional spin valve film, and FIG. 4b shows the MR curve of the spin valve film of the present invention. In FIGS. 4a and 4b, the ordinate represents the MR ratio and H along the abscissa H represents the applied magnetic field.

Each spin valve film is of the dual type. Details of the spin valve film are as described below.

The base layer 11 is [Ta layer (3nm)/NiFeCr (3 nm)]; the antiferromagnetic layer 12 [IrMn layer (5 nm)]; the antiferromagnetic reaction layer 13 in the case of the arrangement using the antiferromagnetic reaction layer 13 [$MnO_2$ (1 nm)]; the ferromagnetic layer 14 [CoFe layer (2 nm)]; the nonmagnetic layer 15 [Cu layer (2.3 nm)]; the free magnetic layer 16 [CoFe layer (3 nm)]; the nonmagnetic layer 18 [Cu layer (2.3 nm)]; the ferromagnetic layer 19 [CoFe layer (2 nm)]; the antiferromagnetic layer 20 [LrMn layer (5 nm)]; and the protective layer 17 [Ta layer (3 nm)]. The numeric values in the parentheses represent the thicknesses of the layers.

As shown in FIG. 4a, the MR ratio of the conventional spin valve film having no antiferromagnetic reaction layer was about 14%. On the other hand, the MR ratio of the spin valve film of the present invention in which the antiferromagnetic reaction layer 13 is provided is about 17%, higher than that of the conventional spin valve film.

It can be understood that the MR ratio is increased if the antiferromagnetic reaction layer 13 is formed between the antiferromagnetic layer 12 and the ferromagnetic layer 14.

The ferromagnetic layer 14 couples to the antiferromagnetic layer 12 by exchange coupling, and the ferromagnetic layer 19 couples to the antiferromagnetic layer 20 by exchange coupling. Magnetization of the ferromagnetic layers 14 and 19 is fixed in one direction by exchange coupling.

Preferably, the ferromagnetic layers 14 and 19 are formed of an alloy containing at least an element selected from Fe, Co and Ni. More preferably, CoFe is used in the present invention.

In the case where the spin valve film is of the dual type, a stacked ferrimagnetic fixed magnetic layer may be formed to further heighten the exchange coupling between the ferromagnetic layers 14 and 19 and the antiferromagnetic layers 12 and 20. The stacked ferrimagnetic fixed magnetic layer is a layer for artificially forming a stacked ferromagnetic structure such that a Ru layer for example is provided between the first and second ferromagnetic layers 14 and 19 to make the directions of magnetization of the first and second ferromagnetic layers 14 and 19 reverse and parallel to each other. It has actually been confirmed that when the Ru film thickness is in the range from 0.5 to 0.9 nm in the CoFe/Ru/CoFe system, the value of (residual magnetization of Mr in the entire film)/(saturation magnetization of Ms) is substantially zero and the directions of magnetization of the first and second ferromagnetic layers 14 and 19 are made reverse and parallel to each other by means of the Ru layer. If such a construction is adopted, the thickness of the Ru layer is preferably 0.6 to 0.8 nm, more preferably about 0.7 nm, i.e., in the range from 0.65 to 0.75 nm. The intermediate layer inserted between the ferromagnetic layers 14 and 19 is not limited to the Ru layer. At least one element selected from Cu, Rh, Pd, Ag, Ir, Pt and Au may be used for the intermediate layer. Also, the intermediate layer may be formed of an alloy containing a plurality of components.

The first and second ferromagnetic layers 14 and 19 may be formed of the same material or may be respectively formed of different materials.

The interlayer coupling magnetic field Hint between the first and second ferromagnetic layers 14 and 19 and the free magnetic layer 16 may be adjusted by setting a film thickness difference between the first and second ferromagnetic layers 14 and 19 or by setting a difference between the values of the products (Ms×t) of the saturation magnetizations Ms and the film thicknesses T of the ferromagnetic layers.

Preferably, the nonmagnetic layers 15 and 18 are formed of a Cu. The interlayer coupling magnetic field Hint between the first and second ferromagnetic layers 14 and 19 can be controlled by changing the film thicknesses of the nonmagnetic layers 15 and 18.

A change in MR characteristic of the spin valve film due to a change in film thickness of the nonmagnetic layers 15 and/or 18 is considerably large. For example, FIGS. 5a and 5b respectively show changes in MR ratio of the spin valve film and changes in interlayer coupling magnetic field Hint between the fixed magnetic layer and the free magnetic layer 16 in the bottom-type spin valve film of a film construction: Ta layer (3 nm)/NiFeCr layer (3 nm)/IrMn layer (5 nm)/CoFe layer (2 nm)/Cu layer (t nm)/CoFe layer (3 nm)/Ta layer (3 nm) when the film thickness of the Cu layer is changed.

Figure 5A:
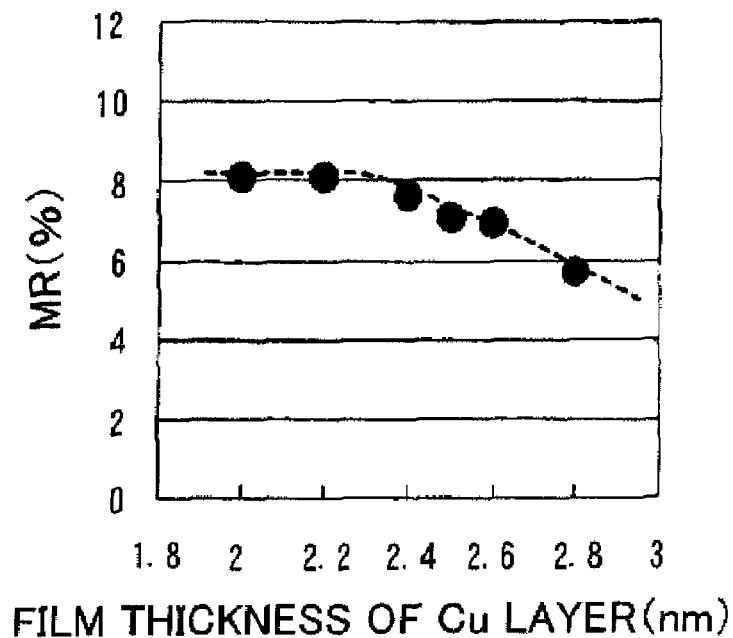
FIG. 5 shows graphs depicting, respectively, the MR ratio with respect to the film thickness of a nonmagnetic layer according to the embodiment, and the dependency of an interlayer coupling magnetic field Hint on the film thickness of the nonmagnetic layer.
Figure 5B:
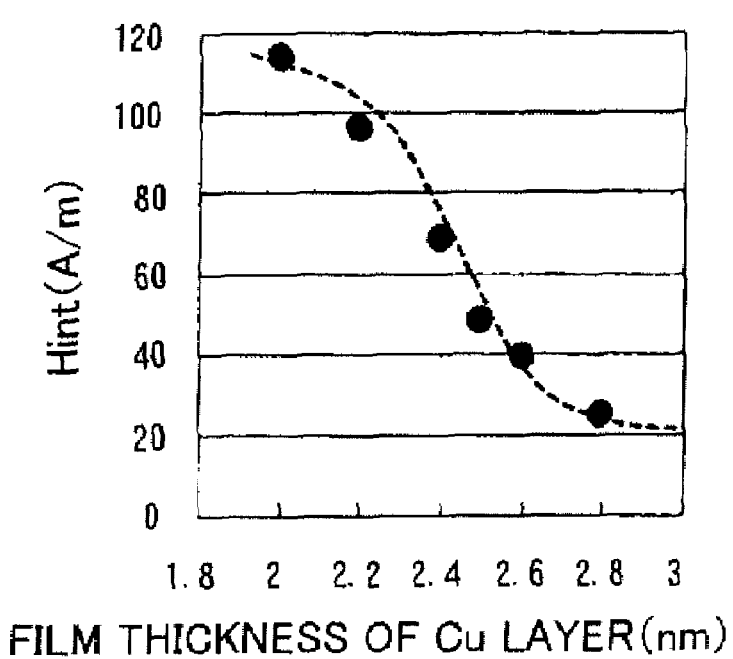

From FIGS. 5a and 5b, it can be understood that each of the MR ratio and the interlayer coupling magnetic field Hint is largely influenced by a small change in film thickness t of the Cu layer. The MR ratio determines the sensitivity of the spin valve film, and the interlayer coupling magnetic field Hint determines the bias point of the free magnetic layer 16. The MR ratio and the interlayer coupling magnetic field Hint are each an important parameter.

Preferably, the free magnetic layer 16 is formed of an alloy containing at least one element selected from Fe, Co and Ni. It is necessary that the magnetization of the free magnetic layer 16 be comparatively freely rotatable with respect to an external magnetic field, and the free magnetic layer 16 needs to have a good soft magnetic characteristic. For the free magnetic layer 16, therefore, a Co-based alloy having a higher coefficient of diffusion at the interfaces on the nonmagnetic layers 15 and 18 and not easily solid-soluble to the nonmagnetic layers 15 and 18 is ordinarily used. However, the free magnetic layer 16 formed of a Co-based alloy has a rather bad soft magnetic characteristic and is it preferable to use a CoFe-based alloy, more specifically $Co_{90}Fe_{10}$. Also, the free magnetic layer 16 may be formed in a two-layer structure constituted by a magnetic layer formed of a Co-based alloy of a high diffusion coefficient and a layer formed of a NiFe alloy having an improved soft magnetic characteristic other than a single-layer structure. Further, a stacked free structure or a spin filter structure comparatively advantageous in reducing the thickness of the free magnetic layer 16 may be used.

The protective film 17 has a role to prevent the spin valve film from being oxidized by each of processes. In the present invention, Ta is suitably used for the protective film 17. The antiferromagnetic layers 12 and 20 (Mn-based alloy) used in the spin valve film actually undergo a heat treatment process at a high temperature and are exposed to the atmosphere after lamination of the spin valve film for pattern formation. Therefore, oxidation caused by such processes can be prevented if the protective film 17 is provided.

EMBODIMENT 2

Figure 6:
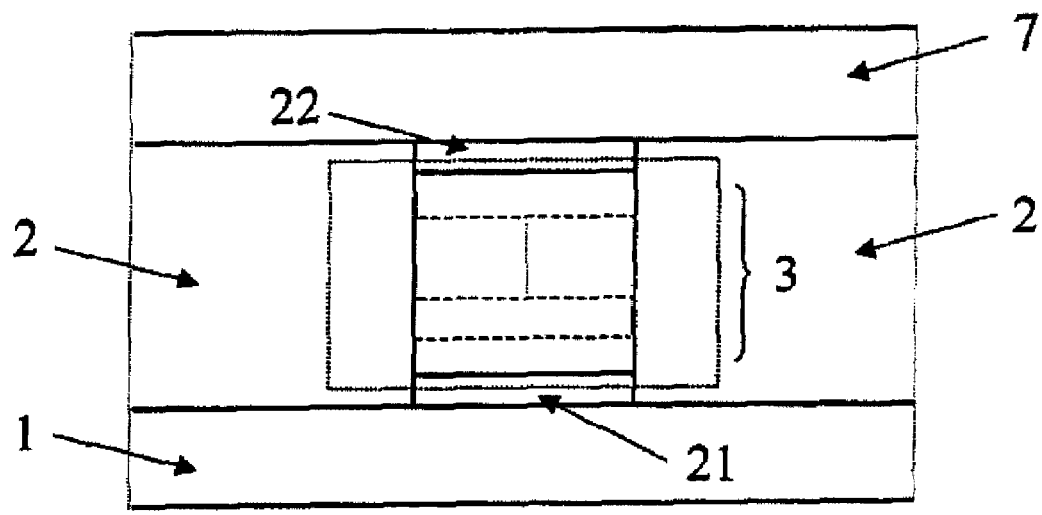
FIG. 6 is an enlarged schematic sectional view of an essential portion of a reproducing head of a magnetic disk apparatus according to Embodiment 2 of the present invention as seen from a head slide surface facing a magnetic recording medium.
Figure 7:
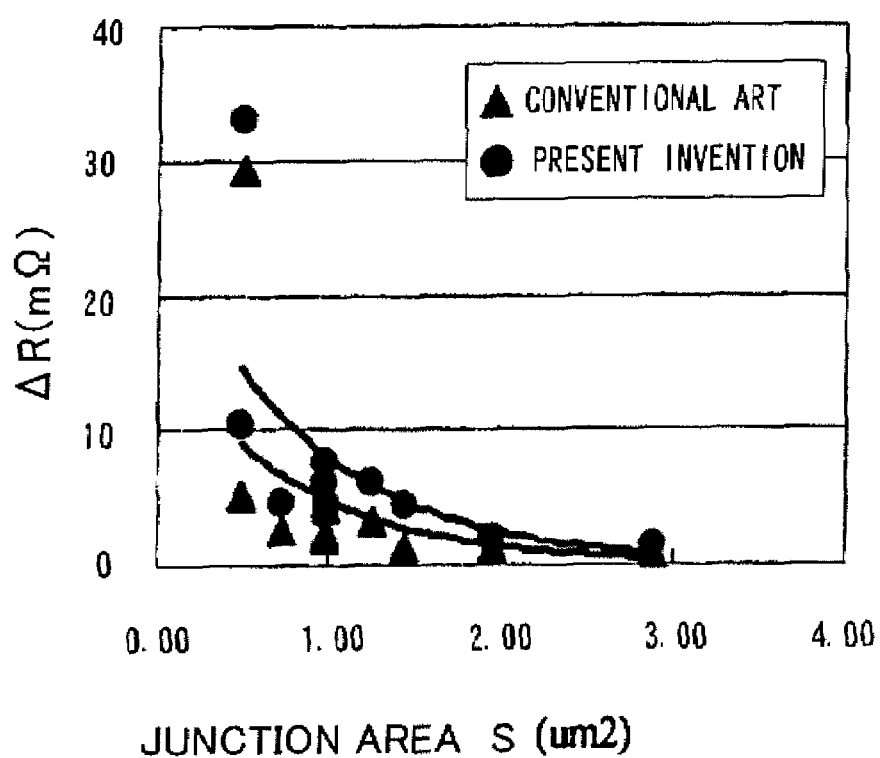
FIG. 7 is a graph depicting the relationship between a junction area and the resistance change rate in a GMR device according to the embodiment.

FIGS. 6 and 7 show Embodiment 2 of the present invention.

Embodiment 2 differs from the above-described Embodiment 1 in that a GMR device 3 in a CPP mode is used.

In a reproducing head for a magnetic disk apparatus shown in FIG. 6, the GMR device 3 is formed under a lower shield layer 1, which is a magnetic film formed of a soft magnetic material such as permalloy, a Co-based amorphous material, or Fe-based fine particles, with a lower electrode lead layer 21 interposed between the GMR device 3 and the lower shield layer 1. In this case, Ta (3 nm)/Cu (300 nm)/Ta (50 nm) is used as the lower electrode lead layer 21

The spin valve film constituting the GMR device 3 is the same as that described in the above description of Embodiment 1. An upper electrode lead layer 22 formed of the same electroconductive material as that of the lower electrode lead layer 21 is provided on the GMR device 3. The structure is such that the GMR device 3 is sandwiched between the lower electrode lead layer 21 and the upper electrode lead layer 22. Tn this case, Ta (3 nm)/Cu (50 nm) is used as the upper electrode lead layer 22.

Front and rear side surfaces of the GMR device 3 are formed as slanted surfaces by an etching method such as ion milling. A gap insulating layer 2 formed of a nonmagnetic insulating material such as $Al_2O_3$, AlN or $SiO_2$ is provided on the lower shield layer 1 on opposite sides of the GMR device 3.

A common shield layer 7 formed of the same soft magnetic material as that of the lower shield layer 1 is provided so as to cover the upper surfaces of the upper electrode lead layer 22 and the gap insulating layer 2, thus forming a device portion of the reproducing head.

In the device portion of the reproducing head constructed as described above, a current supplied from the lower electrode lead layer 21 flows through the GMR device portion 3 to flow into the upper electrode lead layer 22. A structure in which a supplied current flows through the film in the GMR device 3 in a direction perpendicular to the film as described above is called a CPP structure.

The CPP-GMR device constituted by the spin valve film of the present invention as described above and a CPP-GMR device constituted by the conventional spin valve film were operated to examine the relationship between the GMR device 3—lower electrode lead layer 21 junction area S and the resistance change rate $\Delta R$. FIG. 7 shows the obtained measurement results.

In the case of use of the spin valve film of the present invention in which the antiferromagnetic reaction layer 13 is formed between the antiferromagnetic layer 12 and the ferromagnetic layer 14, the resistance change rate $\Delta R$ is increased, as indicated by round marks in FIG. 7, in comparison with that in the case of use of the conventional spin valve film indicated by triangular marks.

The GMR device operates in the CPP mode and uses the spin valve film in which an antiferromagnetic reaction layer is provided between the antiferromagnetic layer and the ferromagnetic layer. The resistance change rate is thereby increased to obtain a higher head output.

EMBODIMENT 3

Figure 8:
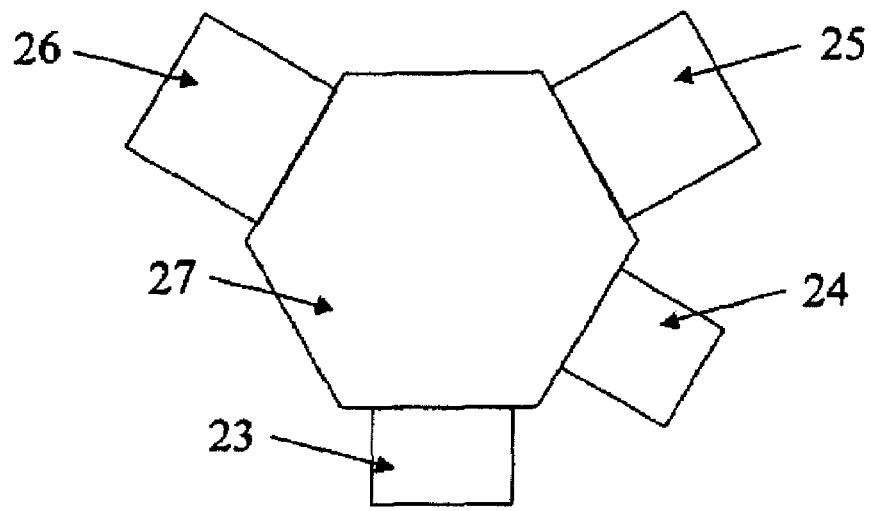
FIG. 8 is a plan view of a sputtering apparatus used in Embodiment 3 of the present invention.
Figure 9:
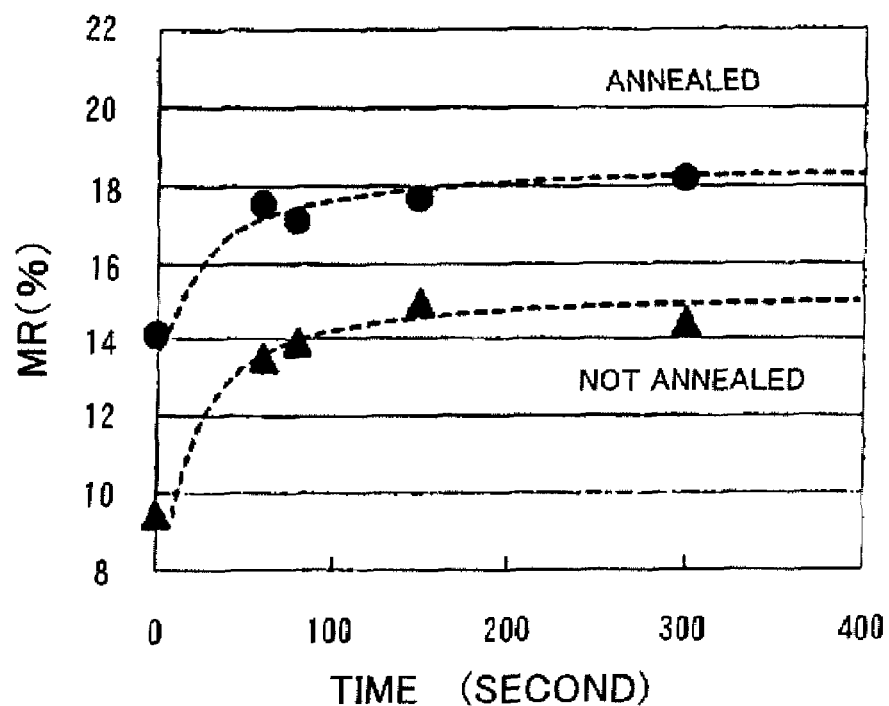
FIG. 9 is a graph depicting the MR ratio with respect to standing-in-vacuum time according to the embodiment.

FIGS. 8 to 10 show Embodiment 3 of the present invention. As this embodiment, a method of fabricating the spin valve film constituting the GMR device portion of the reproducing head in the above-described embodiments will be described.

An apparatus for film forming for the spin valve is not limited to a particular one. A conventional well-known film forming apparatus can be used. A description will be made of a case of using a helicon long-throw sputtering apparatus will be described by way of example, because it is suitable for forming a magnetic film. A feature of the helicon long-throw sputtering apparatus resides in that discharge at a lower gas pressure is possible. Accordingly, the mean free path of fine particles driven out from the target surface is increased, so that a sufficiently high film forming rate can be obtained even if the distance between the target and the substrate is increased. The method of increasing the distance between the target and the substrate has the effect of aligning the angle of incidence fine particles flying to the substrate surface with a vertical direction. During film forming of the magnetic film constituting the spin valve film, fine particles flying to the substrate surface in an oblique direction may act to impair the magnetic characteristics. Therefore, it is desirable that film forming be performed by using mainly particles flying to the substrate surface in the direction perpendicular to substrate surface during film forming of the magnetic film.

FIG. 8 shows the helicon long-throw sputtering apparatus.

A conveyance chamber 27 in which a conveyance device such as a conveyance arm (not shown) for conveying substrates one after another into each of chambers described below is provided at a center of the apparatus. A load/locking chamber 23 for carrying substrates into the sputtering apparatus, a sputtering etching device 24, a high vacuum chamber 25 and a low vacuum chamber 26 are disposed around the conveyance chamber 27. Substrates are successively conveyed to the chambers by the conveyance device provided in the central conveyance chamber 27 and a multilayer film is continuously formed in vacuums.

In the high vacuum chamber 25, only an inert gas such as Ar is used as a sputtering gas and the degree of vacuum to be reached is about $1 \times 10^{-7}$ Pa. In the low vacuum chamber 26, sputtering is performed by using a target containing an impurity such as an oxide and by using a gas (e. g., $O_2$ and $N_2$) other than an inert gas such as Ar as a sputtering gas. The degree of vacuum to be reached the low vacuum chamber 26 is about $1 \times 10^{-6}$ Pa.

The method of fabricating the spin valve film by using the sputtering apparatus arranged as described above will be described. The sputtering film having the dual spin valve structure shown in FIG. 2b in Embodiment 1 described above was fabricated. The structure of the sputtering film is Ta layer/NiFeCr layer/IrMn layer/antiferromagnetic reaction layer/CoFe layer/Cu layer/CoFe layer/Cu layer/CoFe layer/IrMn layer/Ta layer. A sputtering target having a diameter of 5 inches was used.

First, a substrate was placed in the load/locking chamber 23 and evaluation in the load/locking chamber 23 was performed until the desired degree of vacuum was reached. The degree of vacuum to be reached was set to $1.0 \times 10^{-4}$ Pa or lower. After reaching the desired degree of vacuum, the substrate was taken out of the load/locking chamber 23, was then conveyed into the sputtering etching device 24, and underwent a surface treatment on impurities on the substrate surface.

The substrate surface-treated was taken out of the sputtering etching device 24 and conveyed into the high vacuum chamber 25. The base layer 11 was formed and film forming of the spin valve film was successively performed.

Film forming of the spin valve film will be concretely described. First, the first antiferromagnetic film 12 was formed on the substrate in the high vacuum chamber 25.

Subsequently, the substrate was taken out from the high vacuum chamber 25, was then conveyed into another chamber, which was the load/locking chamber 23 in this case, to be left standing for a desired time period in the vacuum at a degree of vacuum lower than the degree of film forming vacuum in the high vacuum chamber 25, thereby performing film forming of the antiferromagnetic reaction layer 13.

The degree of vacuum in the high vacuum chamber 25 is not particularly specified. However, it is preferably in the range from $1 \times 10^{-6}$ to $1 \times 10^{-8}$ Pa.

After film forming of the antiferromagnetic reaction layer 13, the substrate was again conveyed into the high vacuum chamber 25 and the first ferromagnetic layer 14, the first nonmagnetic layer 15, the free magnetic layer 16, the second nonmagnetic layer 18, the second ferromagnetic layer 19, the second antiferromagnetic layer 20 and the protective layer 17 were formed by well-known conventional techniques. The spin valve film having the dual spin valve structure was thereby fabricated. The above-described sequence of spin valve film forming process steps is performed without any break in the maintenance of the vacuum atmosphere.

The substrate on which the antiferromagnetic layer 12 is formed is taken out from the high vacuum chamber 25 and left standing in the load/locking chamber 23 having a lower degree of vacuum as described above, thus enabling the antiferromagnetic reaction layer 13 to be easily formed.

FIG. 9 is a graph showing the relationship between the time during which the substrate after film forming of the antiferromagnetic layer 12 was left standing in the load/locking chamber 23 and the MR ratio of the obtained spin valve film.

In FIG. 9, triangular marks indicate the substrate immediately after film forming of the spin valve film, and round marks indicate the MR ratio of the substrate taken out from the chamber after the completion of film forming of the spin valve film and processed by a heat treatment (annealing) in a vacuum using a well-known annealing apparatus under conditions: 200° C., 2.5 hours, and an applied magnetic field of 240 kA/m.

During measurement, the degree of vacuum in the high vacuum chamber 25 was set to $6.0 \times 10^{-8}$ Pa and the degree of vacuum in the load/locking chamber 23 was set to $3.0 \times 10^{-6}$ Pa.

Table 1 shows data corresponding to that shown in FIG. 9.

TABLE 1

| Surface treatment time (second) | Not annealed MR (%) | Annealed MR (%) |
|---|---|---|
| 0 | 9.4 | 14.09 |
| 60 | 13.54 | 17.47 |
| 80 | 13.96 | 17.05 |
| 150 | 14.94 | 17.65 |
| 300 | 14.43 | 18.13 |

The conventional spin valve film with no antiferromagnetic reaction layer corresponds to the standing time 0 second in FIG. 9. The MR ratio of the film not annealed after the formation of the antiferromagnetic layer 12 was about 9.5%, while the MR ratio of the annealed film was about 14%.

In contrast, in the case of the spin valve film on which the antiferromagnetic reaction layer 13 was formed by the above-described fabrication method of the present invention, the MR ratio after film forming was increased by about 15% and the ME ratio after annealing was increased by about 18%.

Thus, in the present invention, the antiferromagnetic reaction layer 13 can be formed by the process including standing in a vacuum and, as a result, a spin valve film having a higher MR ratio can be obtained. The film thickness of the antiferromagnetic reaction layer 13 can be controlled through the degree of vacuum at which standing in a vacuum is continued and the standing time.

FIG. 10 is a graph showing the relationship between different degrees of vacuum at which standing after film forming of the antiferromagnetic layer 12 was continued and the standardized MR ratio of the spin valve film. A to E on the abscissa indicate conditions after film forming of the antiferromagnetic layer 12. Triangular marks in the graph indicate the results with respect to those not annealed, while round marks indicate the results with respect to those annealed.

A: The spin valve film was grown by the conventional continuous film forming method.

B: After film forming of the antiferromagnetic layer 12, the substrate was temporarily exposed to the atmosphere and the spin valve film was thereafter grown.

C: The substrate was temporarily taken out from the chamber during the time period from film forming of the antiferromagnetic layer 12 to forming of the ferromagnetic layer 14, underwent a heat treatment process in a vacuum in another annealing apparatus, and was again returned to the chamber under the same condition as before, followed by film forming of the spin valve film.

D: After film forming of the antiferromagnetic layer 12, the substrate was conveyed into the load/locking chamber 23 and exposed to a vacuum atmosphere ($8 \times 10^{-8}$ Pa) at a degree of vacuum higher than that in the high vacuum chamber 25, and the spin valve film was grown after this process.

E: After film forming of the antiferromagnetic layer 12, the substrate was conveyed into the load/locking chamber 23 and exposed to a vacuum atmosphere ($3.0 \times 10^{-6}$ Pa) at a degree of vacuum lower than that in the high vacuum chamber 25, and the spin valve film was grown after this process.

As shown in FIG. 10, the spin valve film obtained by leaving the substrate standing in the atmosphere as under the condition B and the spin valve film processed by a heat treatment as under the condition C have a rather reduced MR ratio in comparison with the conventional spin valve film under the condition A. Exposure of the substrate to a high-vacuum atmosphere as under the condition D more or less increases the MR ratio but the effect of increasing the MR ratio is not substantially high.

In contrast, the MR ratio of the spin valve film obtained under the condition E by using the manufacturing method of the present invention, i.e., by exposing the substrate to a low-vacuum atmosphere, is increased by about 25 to 50% relative to that of the conventional spin valve film under the condition A.

That is, for the formation of the antiferromagnetic reaction layer 13, exposure of the substrate to a vacuum atmosphere at a degree of vacuum lower than that in the high vacuum chamber 25 for forming the antiferromagnetic layer 12. Preferably, exposure to a vacuum atmosphere at $1 \times 10^{-7}$ Pa or higher is required.

In the present invention, another method effective in forming the antiferromagnetic reaction layer 13 other than the above-described method is conceivable in which, after film forming of the antiferromagnetic layer 12, the substrate is conveyed into a chamber having an $H_2O$ or $O_2$ concentration higher than that in the film forming process chamber (high vacuum chamber 25) before film forming of the ferromagnetic layer 14, exposed to this atmosphere for about several ten seconds, and thereafter returned to the film forming process chamber, followed by film forming of the ferromagnetic layer 14 and the other layers.

Another method further effective in forming the antiferromagnetic reaction layer 13 is also conceivable in which, after film forming of the antiferromagnetic layer 12, the substrate undergoes a surface treatment by a gas containing 1 ppm or higher of $H_2O$ or $O_2$ and is thereafter returned to the sputtering film forming chamber, followed by film forming of the ferromagnetic layer 14 and the other layers. The substrate surface processing time in this method is not particularly specified but it is preferable to set the surface processing time to 60 seconds or longer because a saturation region is reached it the surface processing time is about 60 seconds, as shown in FIG. 9 and Table 1, as is apparent from the relationship between the surface processing time and the MR ratio (%) proportional to the head output.

While the process of forming the spin valve film including again returning the substrate on which the antiferromagnetic reaction layer 13 is formed to the high vacuum chamber 25 has been described, the present invention is not limited to this process. Film forming in a chamber different from the high vacuum chamber 25 may alternatively be performed.

The invention claimed is:

1. A magnetoresistive-effect device comprising:
an antiferromagnetic layer;
an antiferromagnetic reaction layer;
a ferromagnetic layer;

a nonmagnetic layer; and
a free magnetic layer, wherein
the antiferromagnetic reaction layer is located between the antiferromagnetic layer and the ferromagnetic layer, and the antiferromagnetic reaction layer comprises a metallic compound containing oxygen and a metallic compound containing a same metal as in the antiferromagnetic layer.

2. A magnetoresistive-effect device according to claim 1, wherein the magnetoresistive-effect device is capable of operating with a current direction perpendicular to a film surface (CPP mode).

3. The magnetoresistive-effect device according to claim 1, wherein the antiferromagnetic reaction layer contains Mn.

4. The magnetoresistive-effect device according to claim 3, wherein the antiferromagnetic reaction layer contains at least one constituent selected from the group consisting of nitrogen, hydrogen and $H_2O$.

5. The magnetoresistive-effect device according to claim 1, wherein the antiferromagnetic reaction layer is formed by natural oxidation or plasma oxidation.

6. The magnetoresistive-effect device according to claim 1, wherein the antiferromagnetic layer comprises a Mn-based alloy containing at least one constituent selected from the group consisting of Pt, Ir, Ru and Rh, and a base layer under the antiferromagnetic layer comprises either NiFe or NiFeCr.

7. The magnetoresistive-effect device according to claim 1, wherein the ferromagnetic layer and the free magnetic layer comprise an alloy containing at least one of Fe, Co and Ni, and the nonmagnetic layer comprises an alloy containing Cu.

8. The magnetoresistive-effect device according to claim 1, wherein the ferromagnetic layer comprises a stacked ferromagnetic structure constituted by a first ferromagnetic layer, a metallic intermediate layer and a second ferromagnetic layer, and the metallic intermediate layer is formed of an alloy containing at least one constituent selected from the group consisting of Ru, Cu, Rh, Pd, Ag, Ir, Pt and Au.

9. The magnetoresistive-effect device according to claim 1, wherein a film thickness of the antiferromagnetic reaction layer is .0.1 nm to 2.5 nm.

* * * * *